United States Patent [19]

Kish, Jr. et al.

[11] Patent Number: 5,783,477
[45] Date of Patent: Jul. 21, 1998

[54] METHOD FOR BONDING COMPOUNDS SEMICONDUCTOR WAFERS TO CREATE AN OHMIC INTERFACE

[75] Inventors: Fred A. Kish, Jr., San Jose; David A. Vanderwater, Santa Clara, both of Calif.

[73] Assignee: Hewlett-Packard Company, Palo Alto, Calif.

[21] Appl. No.: 835,948

[22] Filed: Apr. 14, 1997

Related U.S. Application Data

[62] Division of Ser. No. 718,223, Sep. 20, 1996, Pat. No. 5,661,316.

[51] Int. Cl.[6] .................................................. H01L 29/22
[52] U.S. Cl. .................................................. 438/455
[58] Field of Search .................................. 438/455, 456, 438/457, 458, 459

[56] References Cited

U.S. PATENT DOCUMENTS

| | | | |
|---|---|---|---|
| 4,315,591 | 2/1982 | Houston | 228/188 |
| 5,236,118 | 8/1993 | Bower et al. | 438/15 |
| 5,654,583 | 8/1997 | Okuno et al. | 257/627 |

OTHER PUBLICATIONS

Okuno, Yae; Uomi, Kaz; Aoki, Masahiro; Tsuchiya, Tomonobu. "Direct Wafer Bonding of III-V Compound Semiconductors for Free-Material and Fee Orientation Integration." IEEE Journal of Quantum Electronics, vol. 33, No. 6, Jun. 1997.

Okuno, Yae. "Investigation on Direct Bonding of III-V Semiconductor Wafers with Lattice Mismatch and Orientation Mismatch." Applied Physics Letters vol. 68, No. 20, May 13, 1996.

*Primary Examiner*—Charles L. Bowers, Jr.
*Assistant Examiner*—Craig Thompson

[57] ABSTRACT

A method for forming an ohmic interface between unipolar (isotype) compound semiconductor wafers without a metallic interlayer and the semiconductor devices formed with these ohmic interfaces are disclosed. The ohmic interface is formed by simultaneously matching the crystallographic orientation of the wafer surfaces and the rotational alignment within the surfaces of the two wafers and then subjecting them to applied uniaxial pressure under high temperatures to form the bonded ohmic interface. Such an ohmic interface is required for the practical implementation of devices wherein electrical current is passed from one bonded wafer to another.

15 Claims, 6 Drawing Sheets

(100) Surface Orientations (100) Surface Orientations

METHOD FOR BONDING COMPOUNDS SEMICONDUCTOR WAFERS TO CREATE AN OHMIC INTERFACE

CROSS REFERENCE TO RELATED APPLICATION

This is a divisional of application Ser. No. 08/718,223 filed on Sep. 20, 1996 U.S. Pat. No. 5,661,316.

This invention is broadly related to the field of semiconductor device fabrication. It more particularly relates to the fabrication of semiconductor devices using compound semiconductor wafers.

Bonding elemental semiconductor wafers, which includes the attachment of a semiconductor substrate or epitaxial film to another substrate or epitaxial film, is known. For purposes of this disclosure, the term "bonding wafers" also includes the bonding of wafers to epitaxial films and bonding of epitaxial layers to epitaxial layers. Recently, the possibility of bonding compound semiconductor wafers, wherein at least one of the two wafers being bonded comprises a compound semiconductor, has been demonstrated. This bonding permits the integration of multiple devices on a single chip or improved device design for surface emitting lasers and light emitting diodes ("LED"s).

Two methods have been used to bond compound semiconductor wafers. The first places a liquid solution between the wafers. The liquid is allowed to evaporate, leaving the wafers held together by relatively weak van der Waals (electrostatic) forces. Subsequent processing, which may include an annealing step to increase the strength of the bond, is performed at low temperatures, generally less than 200° C. This low temperature limitation is required by the different rates of thermal expansion in dissimilar semiconductor surfaces. This difference, combined with the weak electrostatic forces binding the wafers, can cause them to separate at high temperatures. The weak electrostatic forces holding the wafers together also means that subsequent mechanical operations, which include dicing, grinding, polishing, etc., have caused the debonding of the wafers and consequent difficulties in fabricating a working device. Even when the bond survives the fabrication of the device, the very poor electrical contact between the wafers creates a non-ohmic electrical bond. Ohmic conduction is required for the practical implementation of devices wherein electrical current is to be passed from one bonded wafer to another. The use of a metallic interlayer can create an ohmic contact, but this makes the interface between the two wafers optically absorbing, which is especially undesirable in LEDs, and also limits the possibility of additional high temperature processing.

A second bonding technique for compound semiconductor wafers involves placing the wafers in contact with one another and then annealing the wafers at high temperature (400°–1,200° C.) while external uniaxial pressure is applied. The external force is needed to compensate for the differences in the thermal expansion coefficients of the two wafers, which differences are particularly significant at high temperature, and insures that the wafers remain in intimate contact at the elevated temperatures. This process results in the creation of strong chemical bonds between the wafers, which bonds are much more robust than those created by the previously described process. Wafers so bonded can be sawn, polished, ground, and subjected to further high temperature processing. As the wafers may become ductile at elevated temperatures (>600° C.), the applied uniaxial pressure may serve to deform the wafers, which typically have uneven surfaces. This minimizes the non-bonded areas between the wafers.

One major disadvantage of this method has been the inability to create ohmic current conduction across the unipolar bonded interface. Both n-n and p-p InP/GaAs heterojunctions exhibit some amount of rectification. Laser diode p-n structures wafer-bonded to GaAs or Si substrates exhibit anomalously high forward voltages as a result of this non-ohmic current conduction. These high forward voltages are not acceptable for many device applications.

A method for bonding compound semiconductor wafers which would bond the wafers together strongly and create an ohmic conduction path from the first wafer to the second is therefore highly desirable and not shown by any known reference.

SUMMARY OF THE INVENTION

The present invention, in a first preferred embodiment, comprises a method for creating low resistance ohmic conduction across a compound semiconductor bonded interface by minimizing the number of dislocations and point defects present at the interface. This is accomplished by simultaneously matching the crystallographic orientation of the wafer surfaces and the rotational alignment within the wafer surfaces so that the alignment of atoms across the bonded interface mimics, as closely as possible, that which occurs in a single crystal semiconductor. These techniques minimize the number of electrically active defects at the bonded interface which in turn permits low resistance ohmic conduction across the interface. This conduction can be achieved even in cases where the lattice constants of the two crystal surfaces in the two wafers to be bonded differ significantly.

The teachings of the present invention are needed to facilitate forming ohmic wafer bonded interfaces at the lower temperatures which preserve the compound semiconductor crystal and device properties. The same teachings are not needed to create such an interface when both surfaces consist of elemental semiconductors such as Si. This may be a result of the highly reactive nature of Si surfaces as well as the decreased polarity of the elemental semiconductor crystals. Bulk elemental semiconductors are also more stable with respect to temperature and may be bonded at higher temperatures than compound semiconductors (>1000° C.) without adversely affecting the crystal or device properties. These higher temperatures appear to relax the bonding conditions needed to form an ohmic interface between elemental semiconductors.

The present invention will now be described in detail, with reference to the figures listed and described below.

DETAILED DESCRIPTION OF THE PREFERRED EMBODIMENTS

Figure 1:
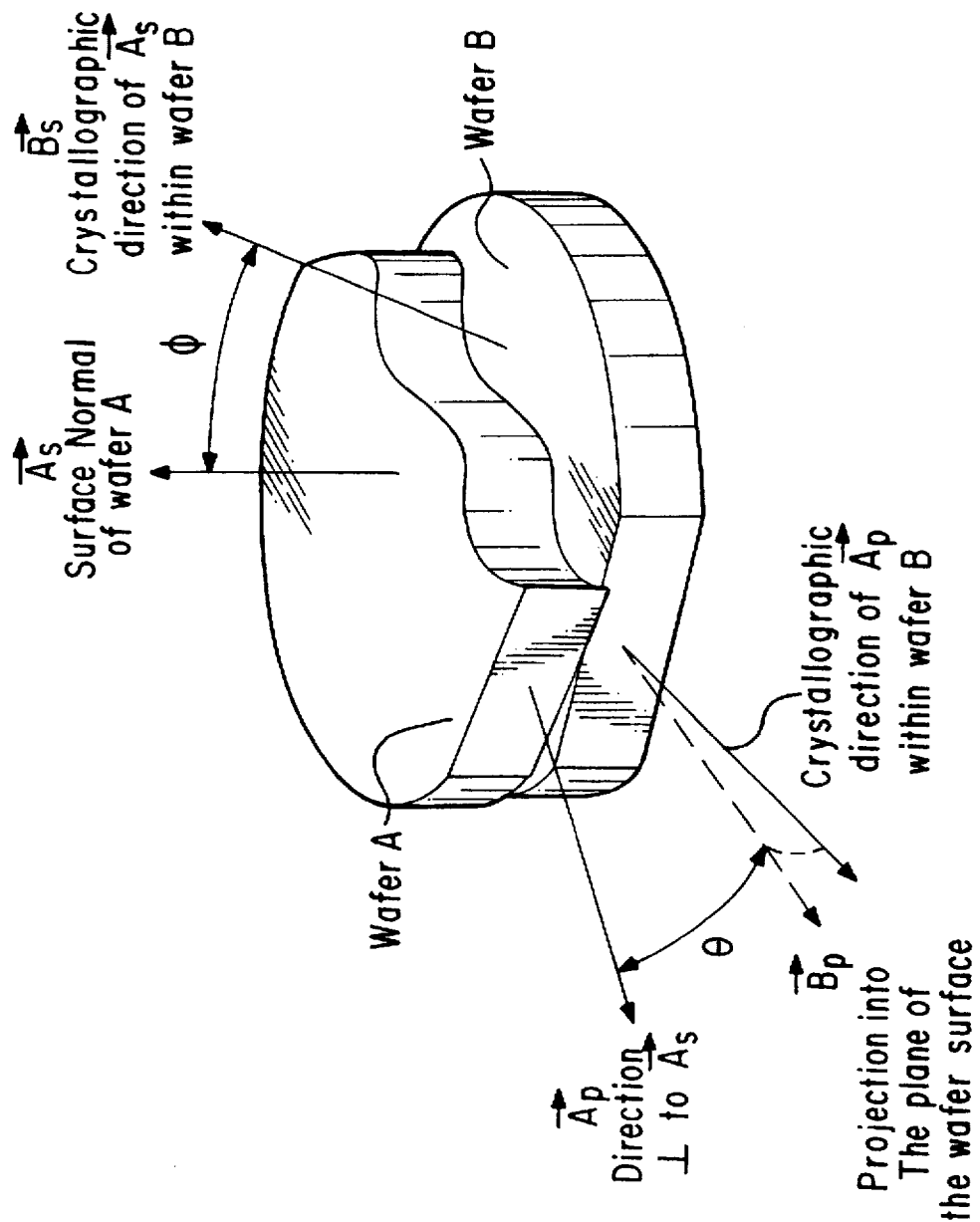
FIG. 1 diagrams how terms "relative crystallographic surface orientation" and "rotational alignment" are used in this disclosure.

Within this disclosure, certain conventions are used to describe the relevant directions for matching the crystallographic surface orientation and rotational alignment of the semiconductor wafers being bonded. FIG. 1 illustrates how these terms are used and described in this disclosure. Vector $A_s$ is normal to the surface of wafer A. Vector $B_s$ has the same crystallographic direction as vector $A_s$, but within wafer B. All crystals are composed of a regular array of atoms which for the purposes of this disclosure can be visualized as consisting of various planar faces. For purposes of this disclosure, the same crystallographic direction indicates that the planar face of the crystals in the second wafer corresponds to the same planar face of the first wafer. As the two wafers can be made from different compounds and may be sawn along different crystal boundaries, vector $B_s$ may project into wafer B at an angle. Wafer misorientation is the magnitude of the angle (|Φ|) between vectors $A_s$ and $B_s$. All references to crystallographic surface orientation refer to the matching of the direction of these vectors. $A_p$ is perpendicular to $A_s$ such that it lies in the plane of wafer A. Vector $B_p$ is the projection of the crystallographic direction of $A_p$ within wafer B into the plane of the surface of wafer B. Wafer misalignment is the magnitude of the angle (|Θ|) between the vectors $A_p$ and $B_p$. Wafer rotational alignment refers to the matching of the direction of these vectors.

Vectors and planes are described using Miller indices with the conventional notation for describing vectors and planes within a crystal being used herein. Thus, "(hkl)" indicates a crystal plane, "{hkl}" indicates equivalent crystal planes, "[hkl]" indicates a crystal direction, and "<hkl>" indicates equivalent crystal directions.

Using the teachings of the present invention, low resistance ohmic conduction has been achieved while bonding wafers of the following compound semiconductors: n-type GaP to n-type $In_xGa_{1-x}P$ (where x=0,0.3, or 0.5), n-type $In_{0.5}Ga_{0.5}P$ to n-type $In_{0.5}Ga_{0.5}P$, n-type $In_{0.5}Ga_{0.5}P$ to n-type GaAs, p-type GaP to p-type $In_yGa_{1-y}P$ (y=0,0.5), p-type $In_{0.5}Ga_{0.5}P$ to p-type $In_{0.5}Ga_{0.5}P$ and p-type GaP to p-type GaAs. The InGaP layers (–0.2–2 μm) are grown by metal organic chemical vapor deposition ("MOCVD") utilizing Te and Zn as the n-type and p-type dopants, respectively. The $In_{0.5}Ga_{0.5}P$ layers are grown lattice-matched on GaAs:Te (n>3×10$^{17}$cm$^{-3}$) or GaAs:Zn(p>1×10$^{18}$cm$^{-3}$) substrates whereas the $In_{0.3}Ga_{0.7}P$ layers are grown lattice-mismatched on GaP:S (n>3×10$^{17}$cm$^{-3}$) substrates. All other materials discussed herein comprise bulk compound semiconductor GaAs:Si, GaAs:Zn, GaP:S or GaP:Zn substrates with doping concentrations >3×10$^{17}$cm$^{-3}$. The compound semiconductor wafer bonding is performed at elevated temperatures under applied uniaxial pressure in a graphite anvil fixture known in the art. In this disclosure, the accuracy of all angular tolerances and alignments specified is +/–0.5°.

The present invention's teaching of proper surface orientation and rotational alignment matching has resulted in a substantial improvement in the electrical properties of the bonded interface between all the materials listed. These effects are due to the intrinsic crystal structure and the nature of the atomic bonding in compound semiconductors. The alignment and orientation matching methods taught herein are thus applicable to all wafer bonding performed at high temperature under applied uniaxial pressure, which serves to recreate the crystal's chemical bonds, wherein at least one surface comprises a compound semiconductor.

As the atoms in most compound semiconductors are arranged in a zinc blende crystal structure, that structure will be assumed in the discussions that follow, unless specifically excepted.

A first embodiment of the present invention was used to bond n-type (n>1×10$^{18}$cm$^{-3}$) $In_{0.5}Ga_{0.5}P$ to n-type GaP (n>3×10$^{17}$cm$^{-3}$). All compound semiconductor wafer bonding of n-GaP to n-$In_{0.5}Ga_{0.5}P$ in this and subsequent embodiments was performed under identical conditions at 1000° C. The temperature was raised to this point over 40 minutes and was then immediately decreased back to room temperature over a 30 minute period. After the bonding operation was completed, full sheet alloyed ohmic contact metallizations were applied to both outer surfaces of the bonded wafers, which were then diced into 20×20 mil chips. All I-V characteristics for GaP/$In_{0.5}Ga_{0.5}P$ isotype heterojunctions are measured by connecting the positive electrode to the GaP side of the junction.

Figure 2:
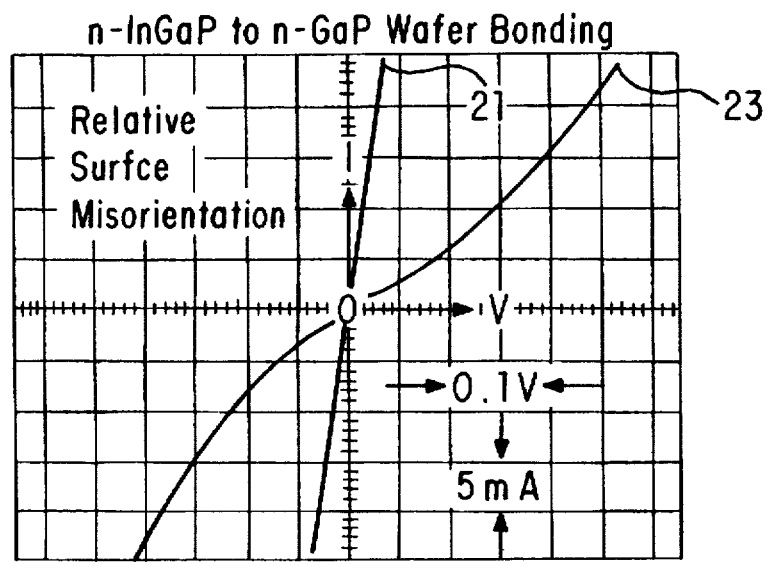
FIG. 2 is a graph of the voltage-current characteristics of two bonded compound semiconductor wafers of InGaP/GaP whose surface orientations are misaligned (Prior Art) and aligned using the teachings of the present invention.
Figure 3:
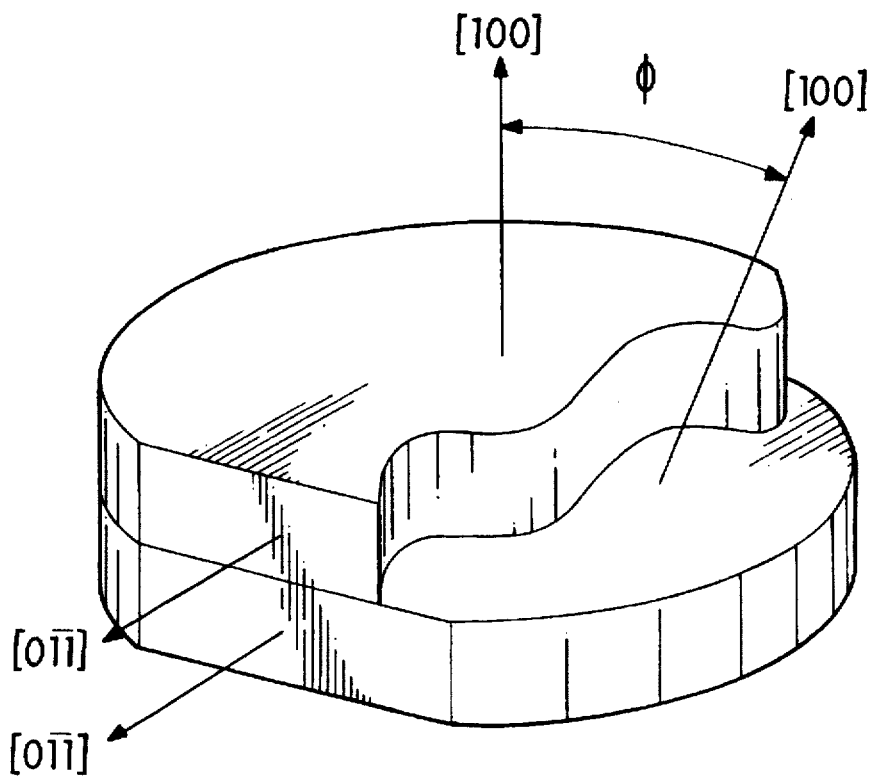
FIG. 3 diagrams a specific case of "relative surface orientation" for nominally (100) oriented wafer surfaces.

The effects of correct wafer orientation are illustrated by the I-V curves shown in FIG. 2. An n-type $In_{0.5}Ga_{0.5}P$ layer with a (100)+2° toward (101) surface orientation was bonded to an n-type GaP substrate with a surface orientation of either (100)+2° toward (101) in a first case or(100)+8° toward (101) in a second case. The I-V curves of the resultant junctions are shown as curves 21 and 23 in FIG. 2, respectively. The wafers are rotationally aligned in both cases. An example of such alignment is shown in FIG. 3 which illustrates the [0 –1 –1] directions aligned by means of flats or cleavage planes at the wafer edges and the [1 0 0] directions misaligned, the magnitude of the misalignment being measured in Φ degrees. For the junction whose I-V curve is shown as 21 in FIG. 2, the magnitude of this angle Φ=0°. For curve 23, the magnitude of this misalignment is Φ=6°. The crystallographic orientation has a dramatic effect on the I-V characteristics of the n-n heterojunction. When the wafer orientations are matched (Φ=0°), the resulting I-V characteristics are ohmic (linear) with a low resistance, $R_s$~1.5Ω, as shown by curve 21. Similar resistance levels have been observed for a single crystal n-GaP wafer metallized on both sides. This indicates that a majority of the resistance remaining in wafers bonded according to the teachings of the present invention arises from the contacts and the bulk material and not from the bonded heterojunction. Curve 23 illustrates the I-V characteristics of wafers bonded with significantly different crystallographic orientation (Φ=6°). Such I-V characteristics are not ohmic and exhibit a relatively high voltage drop of more than 0.25 V at 8 A/cm$^2$ or 20 mA. This voltage drop will substantially increase at the higher current densities typically employed in device applications.

Perfect matching of the wafers' crystallographic orientation is not required to achieve low resistance ohmic conduction. A n-In$_{0.5}$Ga$_{0.5}$P layer with a (100)+2° toward (101) surface orientation was bonded to an n-GaP substrate with surface orientations of (100) and an n-GaP substrate with surface orientations of (100)+4° toward (101). |Φ|=2° in both cases. Both of these bonded wafers exhibited low resistance ohmic conduction similar to that shown in FIG. 2 by curve 21. The wafer surfaces also do not need to be misoriented in the same direction if the magnitude of the crystallographic misorientation is small (|Φ|<6°). Low resistance ohmic conduction can be achieved when bonding an n-In$_{0.5}$Ga$_{0.5}$P layer with a (100)+2° toward (101) surface orientation to an n-GaP substrate with a surface orientation of (100)+2° toward (110) (|Φ|=2.83°). The wafers are rotationally aligned for all these cases (Θ=0°). These results indicate that ohmic conduction across a unipolar compound semiconductor wafer bonded interface can only be achieved if the wafers' relative crystallographic misorientation is less than 6°(|Φ|<6°).

Figure 4:
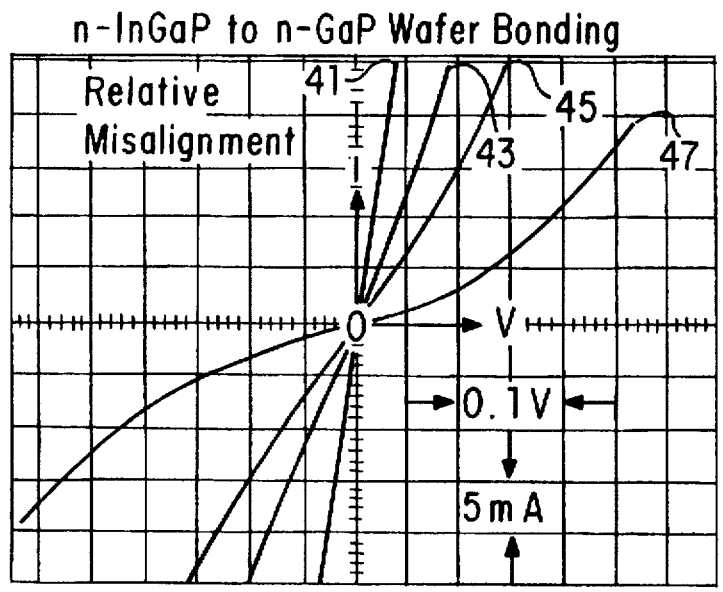
FIG. 4 is a graph of the voltage-current characteristics for isotype heterojunctions formed between bonded InGaP/GaP compound semiconductor wafers with varying degrees of rotational misalignment.
Figure 5:
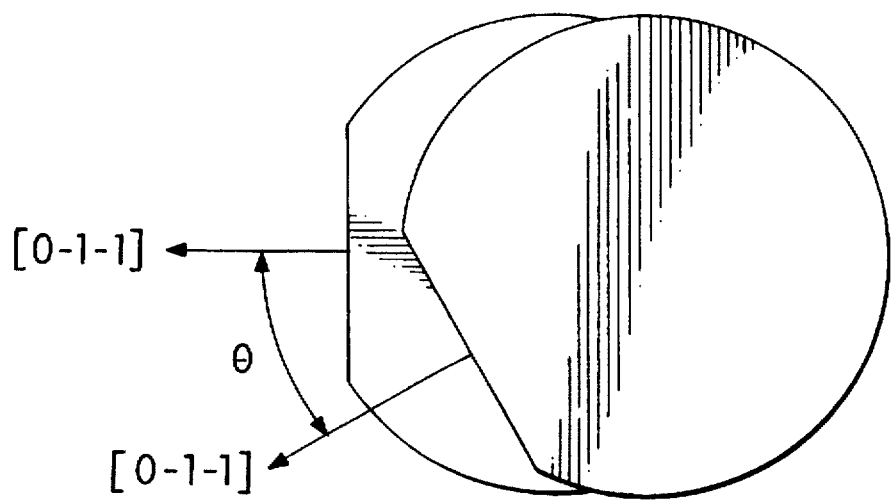
FIG. 5 diagrams a specific case of "rotational wafer alignment" for nominally (100) oriented wafer surfaces.

Proper wafer rotational alignment is also essential for achieving low resistance ohmic conduction at the bonded interface. The effects of various degrees of wafer rotational misalignment are shown in FIG. 4, which is a graph of the I-V performance of n-In$_{0.5}$Ga$_{0.5}$P layers wafer bonded to n-GaP substrates with different wafer rotational alignments. Both bonded layers have a surface orientation of (100)+2° toward (101). FIG. 5 illustrates how the misalignment is measured and shows the misalignment of the [0 −1 −1] directions, indicated by the flats or cleavage planes at the wafers' edges by an angle of magnitude Θ degrees. In FIG. 4, curve 41 indicates that low resistance (R$_s$~1.5Ω) ohmic conduction occurs across the n-InGaP/n-GaP heterojunction when the wafers are aligned with Θ=0°. As the degree of misalignment increases to Θ=5° (curve 43), the current conduction becomes slightly non-linear and non-ohmic and the accompanying voltage drop across the heterojunction increases. These effects become increasingly pronounced as the degree of misalignment increases to Θ=15° (curve 45) and then Θ=20° (curve 47). When Θ=20°, the non-ohmic conduction across the bonded interface results in a voltage drop of >0.25 V at 8 A/cm$^2$(20 mA). Such electrical characteristics are not acceptable for most device applications where current is passed through the bonded interface. For some applications, a moderate degree of non-linearity in the I-V characteristics may be acceptable so long as the voltage drop is not excessive. In these cases moderate misalignments of −20°<Θ<20° are acceptable.

It is not sufficient to match only the crystallographic surface orientation or the wafer rotational alignment. Both the surface orientation and rotational alignment must be simultaneously matched. For the bonded wafers whose performance is illustrated in FIG. 4, the misalignment is equivalent to rotation about the [100] direction. The wafer surface orientation of the bonded wafers is not precisely in the (100) plane ((100)+2° toward (101)). Thus, the wafer rotational misalignment also results in some degree of crystallographic surface misorientation. In FIG. 4, curve 47, with a misalignment of Θ=20° corresponds to a misorientation of |Φ|=0.69°. This misorientation is significantly less than the earlier indicated limit of |Φ|<6°, and does not affect the results shown in FIG. 4 significantly.

Figure 6:
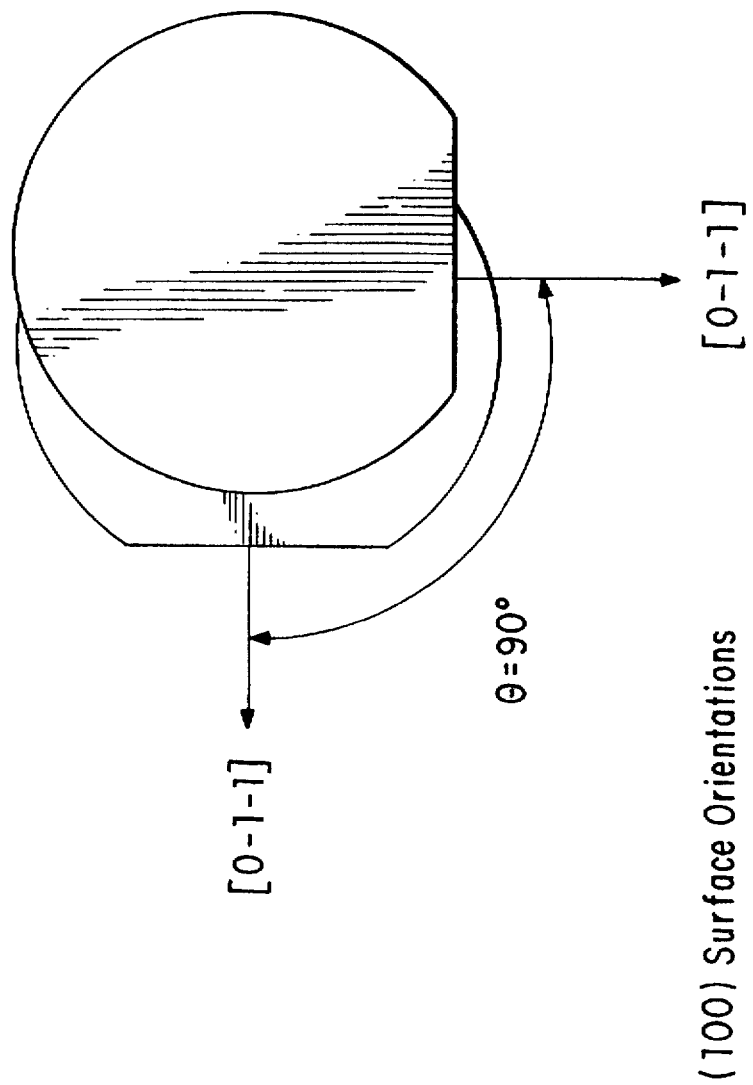
FIG. 6 diagrams a specific case of 90° rotational wafer misalignment for nominally (100) oriented wafer surfaces.
Figure 7:
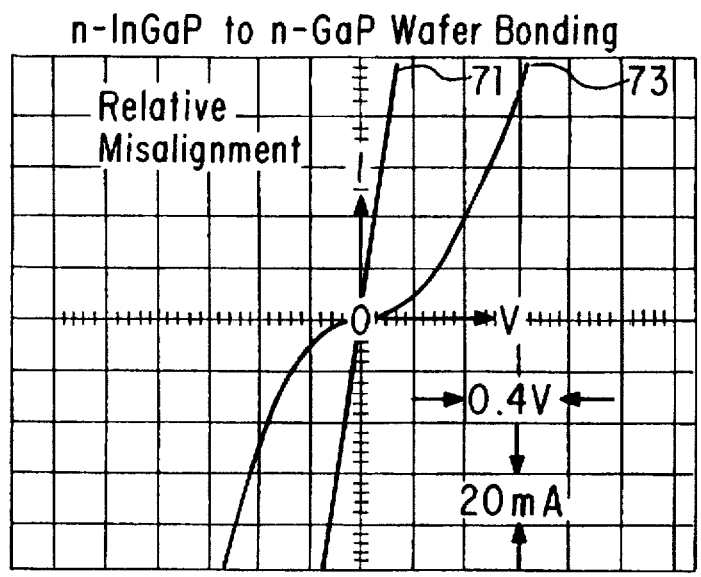
FIG. 7 is a graph of the voltage-current characteristics of two sets of InGaP/GaP bonded compound semiconductor wafers bonded with zero or 90° rotational misalignment.

Increasing the wafer misalignment to Θ=90° also results in non-ohmic conduction across the unipolar compound semiconductor bonded interface. This alignment is illustrated schematically in FIG. 6 with the resultant voltage-current characteristics shown in FIG. 7. As shown in FIG. 7, an n-In$_{0.5}$Ga$_{0.5}$P/n-GaP bonded heterojunction wherein the wafers are misaligned by Θ=90° exhibits the rectifying I-V characteristic shown as curve 73. This heterojunction exhibits an ~0.3 V forward voltage at 8 A/cm$^2$(20 mA) which increases to >0.6 V at 40 A/cm$^2$(100 mA) Curve 71 is a reference and shows the low resistance ohmic conduction obtained when the layers are aligned (Θ=0°). The surface orientation of the layers forming the heterojunctions is (100)+2° toward (101). For both curves 71 and 73, the misorientation (|Φ|) is less than the critical value of 6°. As indicated by curves 71 and 73, even if matching the edges of the cleavage planes of the wafers being bonded was the only design constraint, a wide range of performance would still occur based on the relative rotational alignment. The primary natural cleavage planes for zinc blende crystals are {011} planes. In order to produce low resistance ohmic conduction across the bonded interface, it is critical to align the crystallographic directions within the plane of the wafer surfaces being bonded. Aligning only the cleavage planes at the edges of the wafers is not sufficient as rotation by 90° is not crystallographically invariant for nominally (100) oriented zinc blende crystals. Such rotation is invariant for crystals possessing a diamond structure, including such elemental semiconductors as Si.

The symmetry in a zinc blende crystal makes it impossible to distinguish between rotations about any of the <100> directions by 180°. Low resistance ohmic conduction is possible in a nominally (100) oriented wafer surface for wafer rotational misalignments of Θ=180°. This was confirmed by wafer bonding n-In$_{0.5}$Ga$_{0.5}$P layers to n-GaP substrates with wafer misalignments of Θ=0° and Θ=180°. Both semiconductor surfaces were oriented (100)+2° toward (101) resulting in wafer misorientations of |Φ|=0° or |Φ|=4°. The resulting n-n heterojunctions both exhibit low resistance ohmic conduction similar to that shown by curve 41 in FIG. 4. Wafer misalignments of −20°<Θ<20° or 160°<Θ<200° will provide acceptable electrical characteristics for current conduction across the bonded interface with a minimal voltage drop.

Misalignments resulting from wafers rotated 180° about any of the <100> directions will also provide acceptable electrical characteristics for the conduction of current across the bonded interface provided that the surface orientations of the two wafers are within 6° of crystallographically equivalent directions (|Φ|),and that the wafer alignment within the plane of the wafer surfaces (|Θ|) is simultaneously held to within 20° of crystallographically equivalent directions. These requirements can lead to many special cases which are dependent on the wafer surface orientation. Nominally (111) oriented wafers posses a symmetry such that rotations within the surface, about the [111] direction, by 120° are crystallographically equivalent. The acceptable angles for relative rotational wafer misalignment then become:

$$-20°+n120°<\Theta<20°+n120°, |n|=0,1,2,$$

Any of the above angles Θ should produce a bonded interface that is capable of low resistance current conduction with a minimal accompanying voltage drop. Similarly, nominally oriented (100) surfaces possess 180° rotational symmetry about the [001] and [010] directions. A nominally oriented (100) surface may be wafer bonded to any other surface obtained by rotating the (100) surface by 180° about these directions as long as the nominal surface orientations differ by less than 6° in magnitude and the relative alignment of the wafers in the plane of the bonding surfaces is within 20° of crystallographically equivalent directions.

The foregoing discussion has dealt primarily with compound semiconductor wafer bonding between wafers with a similar crystal structure, e.g. zinc blende to zinc blende, zinc blende to diamond, zinc blende to cubic, and wurtzite to wurtzite. It should also be possible to bond dissimilar crystal structures such as wurtzite to zinc blende to achieve low resistance ohmic conduction across the bonded interface if the surface structures of the layers being bonded possess the same atomic arrangement within a geometric scaling factor. The crystallographic requirements will in this case refer to the "pseudo-surface" orientations of the two surfaces being bonded. The magnitude of the relative misalignment of these "pseudo-surface" orientations is constrained in a similar fashion to be less than 6°. The crystallographic directions in the plane of the wafer surfaces are then defined to be aligned when the atoms across the bonded interface are aligned as closely to that as found in a bulk crystalline semiconductor. The rotational alignment is simultaneously constrained to be less than 20° in magnitude from any equivalent directions wherein the atoms across the bonded interface are aligned as closely as possible to that found in a bulk crystalline semiconductor.

The techniques described herein are generic to the bonding of at least one compound semiconductor to another semiconductor and are relatively independent of the lattice constant or doping types of the bonded surfaces. This has been demonstrated by bonding a p-type ($p > 1 \times 10^{18} \text{cm}^{-3}$) $In_{0.5}Ga_{0.5}P$ layer oriented (100)+0.8° toward (110) to p-type ($p > 1 \times 10^{18} \text{cm}^{-3}$) $In_{0.5}Ga_{0.5}P$ layers oriented either (100)+0.8° toward (110) or (100)+6° toward (110). The wafers were rotationally misaligned by 180° ($\Theta$) in both cases. $\Phi = 1.6°$ in the first case and 6.8° in the second. Although the bonded surfaces had identical lattice constants, which differs from the previously described embodiments, the wafers whose surfaces are nominally aligned ($\Phi = 1.6°$) exhibit low-resistance ohmic conduction similar to curve 21 in FIG. 2. The misaligned surfaces ($\Phi = 6.8°$) exhibit rectifying behavior similar to that shown by curve 23 in FIG. 2.

The resistance of the bonded interface created by following the teachings of the present invention can be further decreased by using moderate to high doping levels ($>3 \times 10^{17} \text{cm}^{-3}$). Merely increasing the doping concentration in the bonded surfaces without the teachings of the present invention does not eliminate the rectifying behavior of the interface and has been tried previously.

The orientation matching taught herein also serves to maintain the crystal quality of the semiconductor crystal bordering the bonded interface. Wafer bonded transparent-substrate $In_{0.5}(Al_xGa_{1-x})_{0.5}P$ LEDs fabricated with no wafer surface misorientation ($\Phi = 0°$) show good crystal quality with no threading dislocations in the active region whereas similar LEDs fabricated with a $\Phi = 6°$ wafer surface misorientation exhibit degraded crystal quality with threading dislocations in the active region which originate from the wafer bonded interface.

Figure 8:
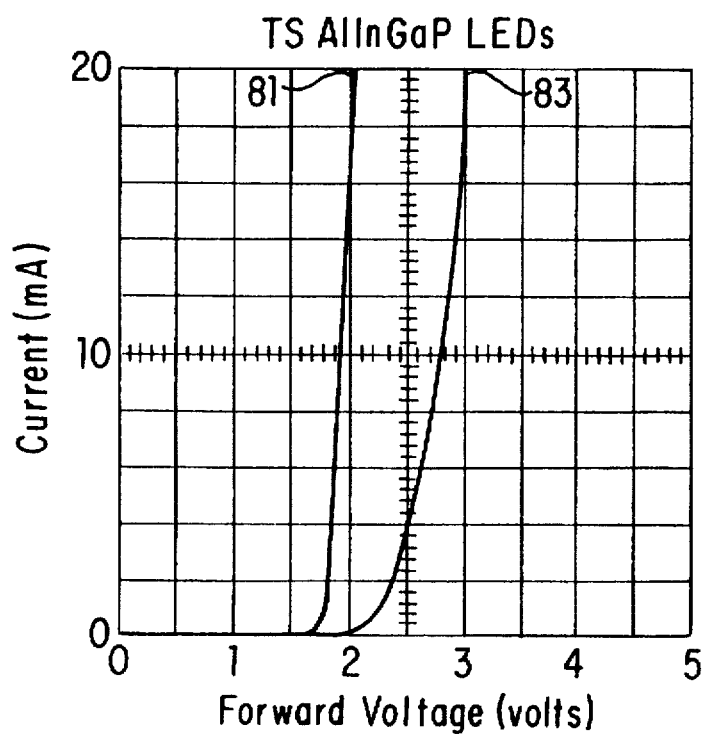
FIG. 8 further illustrates the effects of different alignments (Prior Art and Present Invention) in two sets of LEDs formed using bonded compound semiconductor wafers.

The low resistance compound semiconductor bonded interfaces capable of ohmic conduction that are formed by practicing the present invention are valuable in many device applications. The present inventions's method for wafer bonding has been shown to be a preferred method for fabricating high-efficiency transparent-substrate $In_{0.5}(Al_xGa_{1-x})_{0.5}P$ LEDs. These LEDs are typically fabricated by selectively removing the absorbing n-type GaAs substrate upon which the device layers were initially grown. Next, an optically transparent n-type GaP substrate is wafer bonded in place of the GaAs, using the teachings of the present invention. This device design requires passing current across the wafer bonded interface while maintaining a low forward voltage. FIG. 8 shows the I-V characteristics for semiconductor wafer bonded transparent substrate $In_{0.5}(Al_xGa_{1-x})_{0.5}P$ LEDs with dimensions of 10.5×10.5 mills. All of the $In_{0.5}(Al_xGa_{1-x})_{0.5}P$ epitaxial layers and the GaP substrates have surface orientations of (100)+2° toward (101). Both sets of LEDs whose performance is shown in FIG. 8 are fabricated under the same bonding and processing conditions with the exception of their wafer alignment. The I-V characteristics of curve 81 in FIG. 8 are from a bonded LED wherein all of the crystallographic directions are aligned. These I-V curves exhibit a low forward voltage of ~2.1 V at 20 mA. A high forward voltage (>3 V at 20 mA) results when the wafer alignment ($\Theta$) has been allowed to differ by as much as 90° during fabrication. This is shown by curve 83. This high forward voltage is unacceptable in virtually all practical device implementations. Similar results were obtained but are not illustrated when the magnitude of the wafer's surface misorientation ($|\Phi|$) exceeded 6°.

Figure 9:
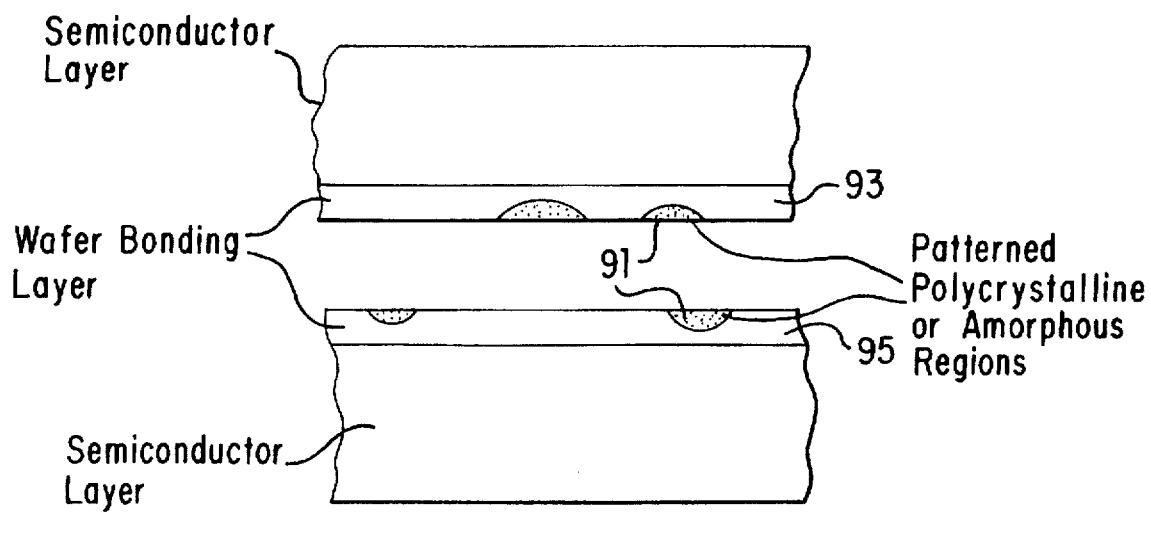
FIG. 9 illustrates how the present invention combined with the selective creation of areas of polycrystalline or amorphous regions in the wafers being bonded can create areas of conduction and non-conduction across the same interface.
Figure 9:
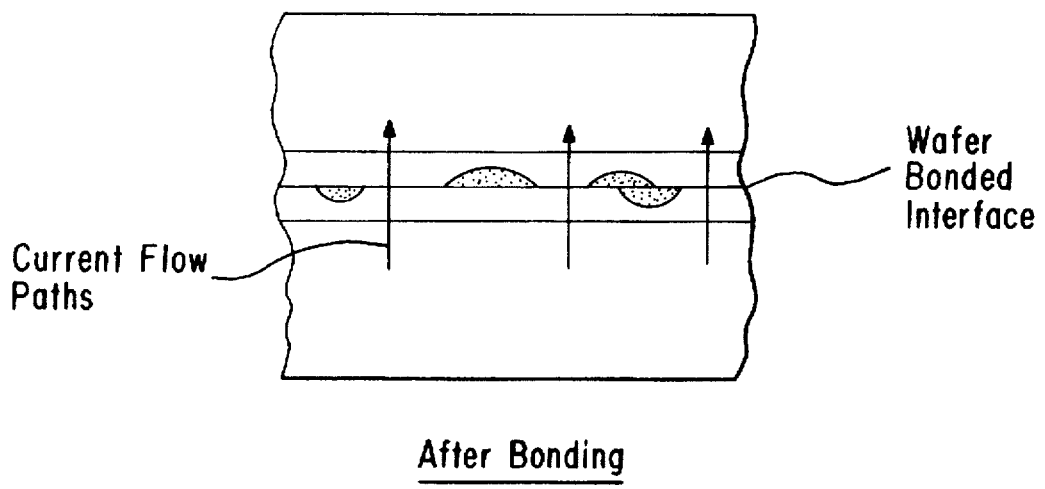

The requirement of the present invention that the atoms of the two semiconductors be nearly aligned across the wafer bonded interface suggests that bonding to an amorphous or polycrystalline layer will result in rectifying I-V characteristics. As shown in FIG. 9, polycrystalline or amorphous layers 91 could be selectively patterned by laser melting and annealing or by ion implantation onto wafer bonding layers 93 and 95. Bonding of patterned layer 91 to another crystalline or patterned layer 93 results in low resistance ohmic conduction if the crystalline layers are aligned across the interface in the manner described and claimed herein. The regions where areas 91 have been deposited create non-ohmic contact areas. The method illustrated in FIG. 9 would be useful for defining paths of current flow in bonded structures.

In the foregoing specification, the invention has been described with reference to a specific exemplary embodiment thereof. It will, however, be evident that various modifications and changes may be made thereunto without departing from the broader spirit and scope of the invention as set forth in the appended claims. The compound semiconductor wafers could have different compositions and crystal structures without departing from the scope of the present invention. Similarly, variations in the degree of alignment and orientation of the crystal planes may be necessary to obtain optimum ohmic conduction in different materials. Many such changes or modifications are readily envisioned. The specifications and drawings are, accordingly, to be regarded in an illustrative rather than restrictive sense.

What is claimed is:

1. A method for bonding at least two semiconductor surfaces to form a bonded interface that exhibits low electrical resistance with a minimal accompanying voltage drop, at least one of the surfaces being bonded comprising a compound semiconductor, the two surfaces having similar doping types, the method comprising the steps of:

heating the two semiconductor surfaces;

aligning the surface orientation of the two semiconductor surfaces;

aligning the rotational alignment of the two semiconductor surfaces; and applying uniaxial pressure to the heated, oriented and aligned surfaces.

2. The method of claim 1 wherein the steps of heating, matching the surface orientation, aligning the rotational alignment, and applying uniaxial pressure may occur in any order.

3. The method of claim 1 wherein the magnitude of the difference between the surfaces' orientations is less than 6 degrees and the magnitude of the difference between the surfaces' rotational alignments is less than 20 degrees.

4. The method of claim 3 wherein the steps of matching the surface orientation and aligning the rotational alignment are relaxed to include crystallographically equivalent directions in the crystal structures of the semiconductor surfaces.

5. The method of claim 3 wherein at least one of the semiconductor surfaces comprises $In_x(Al_wGa_{1-w})_{1-x}P$, where x has a value of from 0 to 1 and w has a value from 0 to 1.

6. The method of claim 5 wherein the second bonding surface comprises $In_y(Al_zGa_{1-z})_{1-y}P$, where y has a value of from 0 to 1 and z has a value of from 0 to 1.

7. The method of claim 2 wherein both surfaces are p-type.

8. The method of claim 2 wherein both surfaces are n-type.

9. The method of claim 6 wherein at least one of the at least two semiconductor surfaces has patterned areas of one of the group of materials including amorphous and polycrystalline semiconductors, bonding of the patterned surface and the second semiconductor surface forming areas of ohmic and non-ohmic conduction.

10. The method of claim 1 wherein the two semiconductor surfaces are heated to a temperature within the range of 200° to 1,100° C.

11. The method of claim 1 wherein the two semiconductor surfaces have a similar crystal structure.

12. The method of claim 10 wherein the two semiconductor surfaces are heated to a temperature within the range of 700° to 1,000° C.

13. The method of claim 4 wherein the at least two semiconductor surfaces have dissimilar crystal structures with the crystal structures having the same atomic arrangement within a geometric scaling factor.

14. The method of claim 7 wherein the doping level of the p-type surfaces is increased to at least $3 \times 10^7 cm^{-3}$ to minimize the resistance across the interface.

15. The method of claim 8 wherein the doping level of the n-type surfaces is increased to at least $3 \times 10^{17} cm^{-3}$ to minimize the resistance across the interface.

* * * * *